US009621105B2

(12) United States Patent
Li et al.

(10) Patent No.: US 9,621,105 B2
(45) Date of Patent: Apr. 11, 2017

(54) ULTRA LOW POWER THERMALLY-ACTUATED OSCILLATOR AND DRIVING CIRCUIT THEREOF

(71) Applicant: NATIONAL TSING HUA UNIVERSITY, Hsinchu (TW)

(72) Inventors: Sheng-Shian Li, Taoyuan (TW); Kuan-Hsien Lee, New Taipei (TW); Cheng-Chi Chen, Zhudong Township, Hsinchu County (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 14/961,252

(22) Filed: Dec. 7, 2015

(65) Prior Publication Data

US 2016/0336941 A1 Nov. 17, 2016

(30) Foreign Application Priority Data

May 12, 2015 (TW) .............................. 104115117 A
Jun. 25, 2015 (TW) .............................. 104120435 A (51) Int. Cl.
*H03B 5/30* (2006.01)
*H03H 9/02* (2006.01)
(Continued)

(52) U.S. Cl.
CPC ........... *H03B 5/30* (2013.01); *H03H 9/02259* (2013.01); *H03H 9/2463* (2013.01);
(Continued)

(58) Field of Classification Search
CPC .. H03B 5/30; H03H 9/02259; H03H 9/02338; H03H 9/02244;
(Continued)

(56) References Cited

U.S. PATENT DOCUMENTS

| 8,228,130 B1 * | 7/2012 | Ivanov ................... | H03B 5/364 |
| | | | 331/107 A |
| 9,209,746 B2 * | 12/2015 | Phan Le .................. | H03B 5/30 |
| 2013/0285676 A1 * | 10/2013 | Rahafrooz ........... | H03H 3/0072 |
| | | | 324/633 |

OTHER PUBLICATIONS

Rahafrooz et al., "High-Frequency Thermally Actuated Electromechanical Resonators With Piezoresistive Readout", Electron Devices, IEEE Transactions on 58.4 (2011): 1205-1214.*

* cited by examiner

*Primary Examiner* — Ryan Johnson
(74) *Attorney, Agent, or Firm* — Muncy, Geissler, Olds & Lowe, P.C.

(57) ABSTRACT

An ultra low power thermally-actuated oscillator and driving circuit thereof are provided. The ultra low power thermally-actuated oscillator includes proof masses, thermally-actuated element and a plurality of driving elements. The proof masses is symmetrically disposed and suspended from a substrate by spring structure. The thermally-actuated element is a line structure to effectively reduce the motional impedance and direct current power. Wherein, the thermally-actuated element is connected to the proof masses or the spring structure. The plurality of driving elements are respectively disposed on both sides of the thermally-actuated element to provide a driving current. When the driving current flows through the thermally-actuated element, the thermally-actuated element will be deformed and thus the proof masses will be driven to produce a harmonic oscillation.

12 Claims, 6 Drawing Sheets

(51) Int. Cl.
*B81B 3/00* (2006.01)
*H03H 9/24* (2006.01)

(52) U.S. Cl.
CPC ....... *B81B 3/0081* (2013.01); *B81B 2201/031* (2013.01); *B81B 2203/0109* (2013.01); *B81B 2203/0163* (2013.01); *H03H 2009/02291* (2013.01); *H03H 2009/02307* (2013.01); *H03H 2009/02322* (2013.01)

(58) Field of Classification Search
CPC .......... H03H 2009/02267; H03H 2009/02291; H03H 2009/02307; H03H 2009/02322; H03H 9/2405; H03H 9/2463; B81B 3/0081; B81B 2201/0271; B81B 2201/031; B81B 2203/0109; B81B 2203/0163
See application file for complete search history.

ULTRA LOW POWER THERMALLY-ACTUATED OSCILLATOR AND DRIVING CIRCUIT THEREOF

CROSS-REFERENCE TO RELATED APPLICATION

This application claims priorities from Taiwan Patent Application No. 104115117, filed on May 12, 2015 and Taiwan Patent Application No. 104120435, filed on Jun. 25, 2015, in the Taiwan Intellectual Property Office respectively, the content of which are hereby incorporated by reference in their entirety for all purposes.

BACKGROUND OF THE INVENTION

1. Field of the Invention

The present invention relates to an ultra low power thermally-actuated oscillator, in particular to an oscillator in which only a current with low power consumption is required to be applied to produce deformation of a line-structured thermally-actuated element, which drives the proof masses of the oscillator to produce the corresponding harmonic oscillation.

2. Description of the Related Art

Micro-electro-mechanical systems oscillators (MEMS oscillators) can generally be categorized into three types, i.e., capacitive, piezoelectric and thermal-piezoresistive, and each has its advantages and disadvantages respectively. The capacitive oscillator may provide low power, high mechanical quality factor (Q) in vacuum and good IC compatibility, but it suffers from poor linear effect and complicated manufacturing process, and requires a larger transduction area and a tiny capacitor gap, such that the Q of the resonator is low in the atmosphere and the frequency response of the resonator is easily interfered by the parasitic capacitance so that the ratio of signal to background feedthrough signal is low, and the phase change is small. The piezoelectric oscillator has an extremely high electromechanical coupling coefficient, so that the motional impedance is low, but it has disadvantages of low Q, for example, the manufacturing process of the substrate materials is difficult to be integrated with the CMOS process. Therefore, the application of the piezoelectric oscillator is also limited.

The thermally-actuated oscillator converts heat energy into a driving force. The manufacturing process thereof is simple and only one to two photo masks are required, as compared to those of the capacitive and piezoelectric oscillators which require the large sensing area or tiny capacitor gap. Furthermore, the compatibility with the CMOS manufacturing process is high because the MEMS structural material is silicon, the resonator still has a considerable Q in the atmosphere, and self-sustained oscillation by using thermal, mechanical, electrical coupling effects inside its structure is feasible. Currently, the lowest operational power for oscillators recorded in the literature is about a few mW.

SUMMARY OF THE INVENTION

At present, there is no literature which shows a solution about how to realize an ultra low power consumption thermally-actuated oscillator. Therefore, according to the above description, the inventor of the present invention has designed an ultra low power thermally-actuated oscillator and driving circuit thereof. Wherein, it is also extremely suitable to be used as a sensor in the gaseous environment.

In view of the problems described above, the objective of the present invention is to provide an ultra low power thermally-actuated oscillator which utilizes three dimensional scaling down nanostructure of thermal actuator to reduce the thermal time constant effectively, such that the mechanical response of thermal driving can keep up with the resonance frequency of micromechanical resonator. Furthermore, the power consumption can be significantly reduced due to decreased volumes of elements.

In view of the problems described above, the objective of the present invention is to provide an ultra low power thermally-actuated oscillator which makes use of thermal, mechanical, electrical coupling effects inside the structure of oscillator. It is not necessary to connect to external active amplification circuit to make proof masses to oscillate at the MEMS resonance frequency.

In view of the problems described above, the objective of the present invention is to provide an ultra low power thermally-actuated oscillator which makes use of the line-structured thermally-actuated element and its associated configuration with the proof masses. The threshold power of the thermally-actuated oscillator can be reduced.

In view of the problems described above, the objective of the present invention is to provide an ultra low power thermally-actuated oscillator which makes use of different forms of spring structures associating with rotational inertia of the proof masses. The mechanical relation of the spring structures and the rotational inertia affects the oscillation frequency of the oscillator.

In view of the problems described above, the objective of the present invention is to provide an ultra low power thermally-actuated oscillator which can simplify the complexity of circuit design and power consumption. Thereby, the objective of miniaturization and cost reduction may be achieved.

In view of the problems described above, the objective of the present invention further discloses a driving circuit of an ultra low power thermally-actuated oscillator which makes use of design of circuit configuration with bias transistors to achieve the self-sustained oscillation of the thermally-actuated oscillator. The functions of the bias transistors are as follows: (1) replacing the large bias elements such as resistors or inductors, thus reducing the power consumption and the volume or size of the total system; (2) served as an input end of feedback circuit control; (3) suitable for circuit integration; and (4) tuning the oscillation frequency of the thermally-actuated oscillator.

Based on the objectives described above, the present invention provides an ultra low power thermally-actuated oscillator, which includes at least one set of proof masses, at least one thermally-actuated element and a plurality of electrical driving elements. The at least one set of proof masses is symmetrically disposed and suspended from a substrate by at least one spring structure. The at least one thermally-actuated element may be a line structure to raise the electrical impedance of the thermally-actuated oscillator and reduce the thermal capacitance of the thermally-actuated oscillator at the same time. The at least one thermally-actuated element is connected to the at least one set of proof masses. The plurality of electrical driving elements are respectively disposed on both sides of the at least one thermally-actuated element to provide an electrical driving current. When the driving current flows through the at least one thermally-actuated element, the at least one thermally-actuated element will be deformed due to the temperature variation and thermal stress, thus driving the at least one set of symmetrically disposed proof masses to generate a harmonic oscillation at resonance frequency.

Based on the objectives described above, the present invention also provides an ultra low power thermally-actuated oscillator, which includes at least one set of proof masses, at least one thermally-actuated element and a plurality of driving elements. The at least one set of proof masses is symmetrically disposed and suspended from a substrate by at least one spring structure. The at least one thermally-actuated element may be a line structure to enhance the electrical impedance of the thermally-actuated oscillator and reduce the thermal capacitance of the thermally-actuated oscillator. The at least one thermally-actuated element is connected to the at least one spring structure. The plurality of driving elements are respectively disposed on both sides of the at least one thermally-actuated element to provide a driving current. When the driving current flows through the at least one thermally-actuated element, the at least one thermally-actuated element will be deformed and thus the at least one set of symmetrically disposed proof masses will be driven to produce a harmonic oscillation at resonance frequency.

Wherein, the line structure of the thermally-actuated element indicates that the structural thickness of the line structure is smaller than the structural thickness of the proof masses.

Preferably, the line structure of the thermally-actuated element may be a single-line line structure or array-line line structure with any single line width or thickness narrower than 2 μm.

Preferably, the at least one spring structure may include a stretching spring structure, a rotational spring structure or combinations thereof.

Preferably, the plurality of driving elements may further include two electrodes made of an electrically conductive material.

Based on the objectives described above, the present invention also provides a driving circuit of thermally-actuated oscillator, which includes a thermally-actuated oscillator and a driving circuit. The thermally-actuated oscillator includes two electrodes, at least one set of proof masses, at least one thermally-actuated element and a plurality of driving elements. The driving circuit includes a bias transistor, wherein a bias voltage is inputted at a control end of the bias transistor. A current input end of the bias transistor, a current output end of the bias transistor and the two electrodes form a current loop to drive a self-sustained oscillation of the thermally-actuated oscillator.

Preferably, the thermally-actuated element may be a line structure.

Preferably, the driving circuit may further include a positive feedback loop. The positive feedback loop may be connected to the control end of the bias transistor to reduce the driving power.

Preferably, the driving circuit may further include a negative resistance circuit. The negative resistance circuit may be connected to any output end of the thermally-actuated oscillator to reduce the driving power.

Preferably, the driving circuit may include a voltage amplifier, a current amplifier, a transimpedance amplifier, a transconductance amplifier, a temperature compensation circuit, a frequency counter circuit, a differential circuit, an electrical feedback connecting line, a phase shifter, a wave filter, a frequency multiplier, a frequency eliminator, or combinations thereof in order to increase the control accuracy of the thermally-actuated oscillator.

The objective of the present invention is to provide an ultra low power thermally-actuated oscillator and driving circuit thereof, which may have one or more advantages described below:

(1) simplifying circuit design: the self-sustained oscillation of the oscillator may be maintained through interactive cycling and effect of coupling between heat, machine, current and voltage by using a simple driving circuit to further reduce the required power of the oscillator.

(2) enhancing performance: different oscillation modes and frequencies may be obtained by designing different sizes of element structures of the oscillator, changing the configuration of the related elements, and changing the vibrating modes.

(3) simplifying manufacturing process: the frequency of use of the process mask is decreased to reduce the time course for the design of mask and simplify the manufacturing process.

(4) changing structural design: the present invention performs design change in connection with key elements of the thermally-actuated oscillator (thermally-actuated elements, spring structures) in order to change the resonance frequency of the oscillator. Further, the required total bias voltage in the circuit may be further reduced in connection with the thermally-actuated elements, i.e. replacing the beam structure with the line structure. Preferably, the undercut manufacturing process may also be used to reduce the volume of the thermally-actuated elements. Furthermore, the spring coefficient in the oscillation term of the oscillator is changed by using rotational spring structure.

(5) reducing the required power: all the voltage stress is mainly distributed on the thermally-actuated element by extending driving electrodes to the surrounding of the thermally-actuated element to effectively reduce the equivalent parasitic resistance. Furthermore, the effects of parasitic capacitance and resistance may be further reduced and the required driving power may be effectively decreased by designing the current not to flow through the proof masses.

In order to make the objectives, the technical features and the benefits after the practical implementation more apparent and comprehensible, the present invention will be illustrated in more detail below with reference to preferred embodiments and the corresponding related drawings.

DETAILED DESCRIPTION OF THE PREFERRED EMBODIMENTS

In order to facilitate the understanding of the features, the contents and the advantages of the present invention, and the effectiveness thereof that can be achieved, the present invention will be illustrated in detail below through embodiments with reference to the accompanying drawings. On the other hand, the diagrams used herein are merely intended to be schematic and auxiliary to the specification, but are not necessary to be true scale and precise configuration after implementing the present invention. Thus, it should not be interpreted in accordance with the scale and the configuration of the accompanying drawings to limit the scope of the present invention on the practical implementation.

The advantages, the features and the achieved technical method of the present invention will be more readily understood by illustrating in more detail with reference to the exemplary embodiments and the accompanying drawings. The present invention may be embodied in different forms, and thus should not be construed as only limited to the embodiments stated herein. On the contrary, to the person having ordinary skill in the concerned art, the embodiments provided would make this disclosure more thorough and complete and fully convey the scope of the present invention, and the present invention will only be defined by the appended claims.

Figure 1:
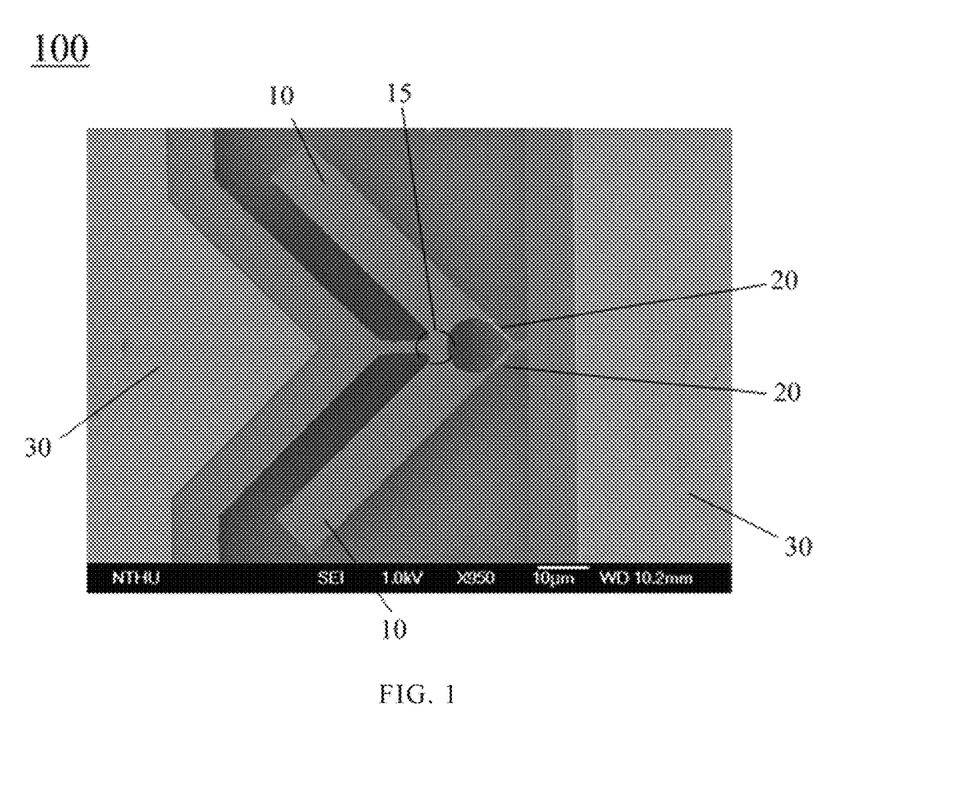
FIG. 1 is a schematic diagram of the first embodiment of the ultra low power thermally-actuated oscillator of the present invention.
Figure 2:
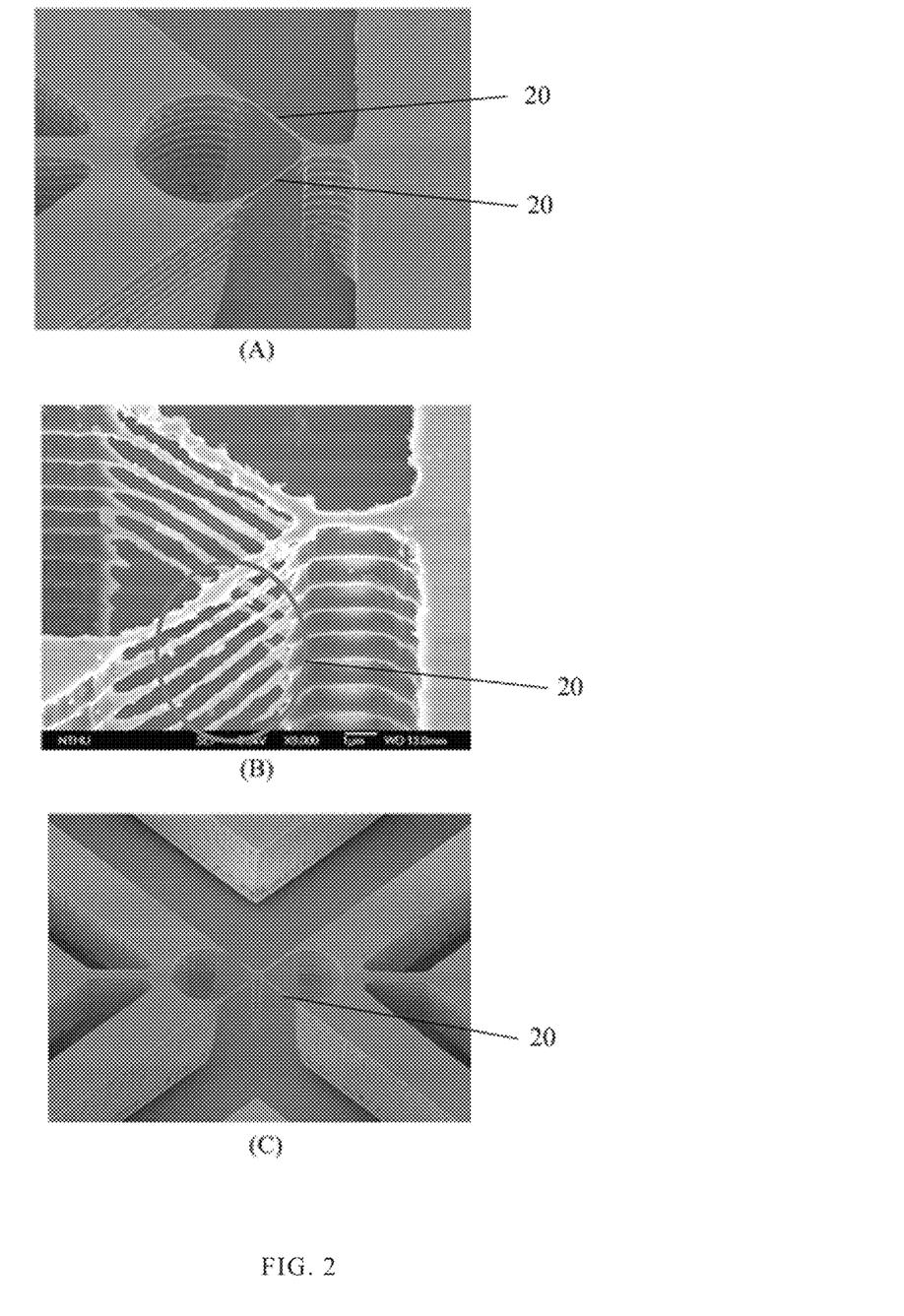
FIG. 2 is a schematic diagram of the forms of line structures of thermally-actuated elements of the ultra low power thermally-actuated oscillator of the present invention.

Please refer to FIG. 1 and FIG. 2 at the same time, an ultra low power thermally-actuated oscillator 100 of the present invention includes at least one set of proof masses 10, at least one thermally-actuated element 20 and a plurality of driving elements 30. The at least one set of proof masses 10 is symmetrically disposed and suspended from a substrate by at least one spring structure. For implementation, the structural material may be any material with piezoresistive properties. The most common types of materials are such as germanium, polycrystalline silicon, amorphous silicon, silicon carbide and single crystal silicon etc.

The at least one thermally-actuated element 20 may be a line structure to enhance electrical impedance of the thermally-actuated oscillator and reduce thermal capacitance of the thermally-actuated oscillator at the same time. The at least one thermally-actuated element 20 is connected to the at least one set of proof masses 10. The plurality of driving elements 30 are respectively disposed on both sides of the at least one thermally-actuated element 20 to provide a driving current. When the driving current flows through the at least one thermally-actuated element 20, the at least one thermally-actuated element 20 will be deformed and thus the at least one set of symmetrically disposed proof masses 10 will be driven to produce a harmonic oscillation at resonance frequency.

Further, the thermally-actuated element 20 is an extremely important key element in the thermally-actuated oscillator. Currently, the related studies in connection with the thermally-actuated element 20 are only limited to the problem on how to reduce the width size of the beam structure, but did not find out the possibility of enhancing the driving impedance through reduction in three dimensional volume. The present invention discloses that a submicron size structure is produced by using undercut effect. The beam structure may be etched to different forms such as single line structure or array line structure (Referring to FIG. 2) step by step according to practical design requirements. The main feature thereof is that the line structure has a structural thickness which is smaller than structural thickness of the proof masses.

The thermally-actuated element 20 appearing in the form of line structure may significantly enhance the electrical impedance and driving efficiency, such that the thermal response rate can keep up with the resonance frequency of the total structure. Furthermore, the power consumption may be significantly reduced due to the decrease in the volume of the thermally-actuated element 20. For implementation, the thermally-actuated element 20 may be implemented in any form with a single wire structure having a width or thickness smaller than 2 μm, and preferably smaller than 1 μm.

When the driving element 30 applies the driving current to the thermally-actuated element 20, the temperature change will be produced to the thermally-actuated element 20 due to thermal agitation and circuit noise so that the heat is converted into the thermal driving force by the thermal expansion effect. The mechanical displacement from the thermal agitation at the natural resonance frequency of the structure is particularly magnified. When the loop gain of the internal feedback process among the thermal, mechanical and electrical coupling fields is greater than 1 and the phase is close to 0 degree, the proof masses 10 will be self-oscillated. Wherein, the natural resonance frequency of the structure may be derived by the spring structure and the rotational inertia of the proof masses 10.

Example is given for illustration but is not limited thereto. As one can know from the figures, the proof masses 10 are connected to the substrate by using the rotational spring structure 15 in the first embodiment. When the proof masses 10 are configured as named "Wing-type" and the proof masses 10 are properly connected to the substrate by using the rotational spring structure 15, an oscillation frequency of oscillator may be generated.

Figure 3:
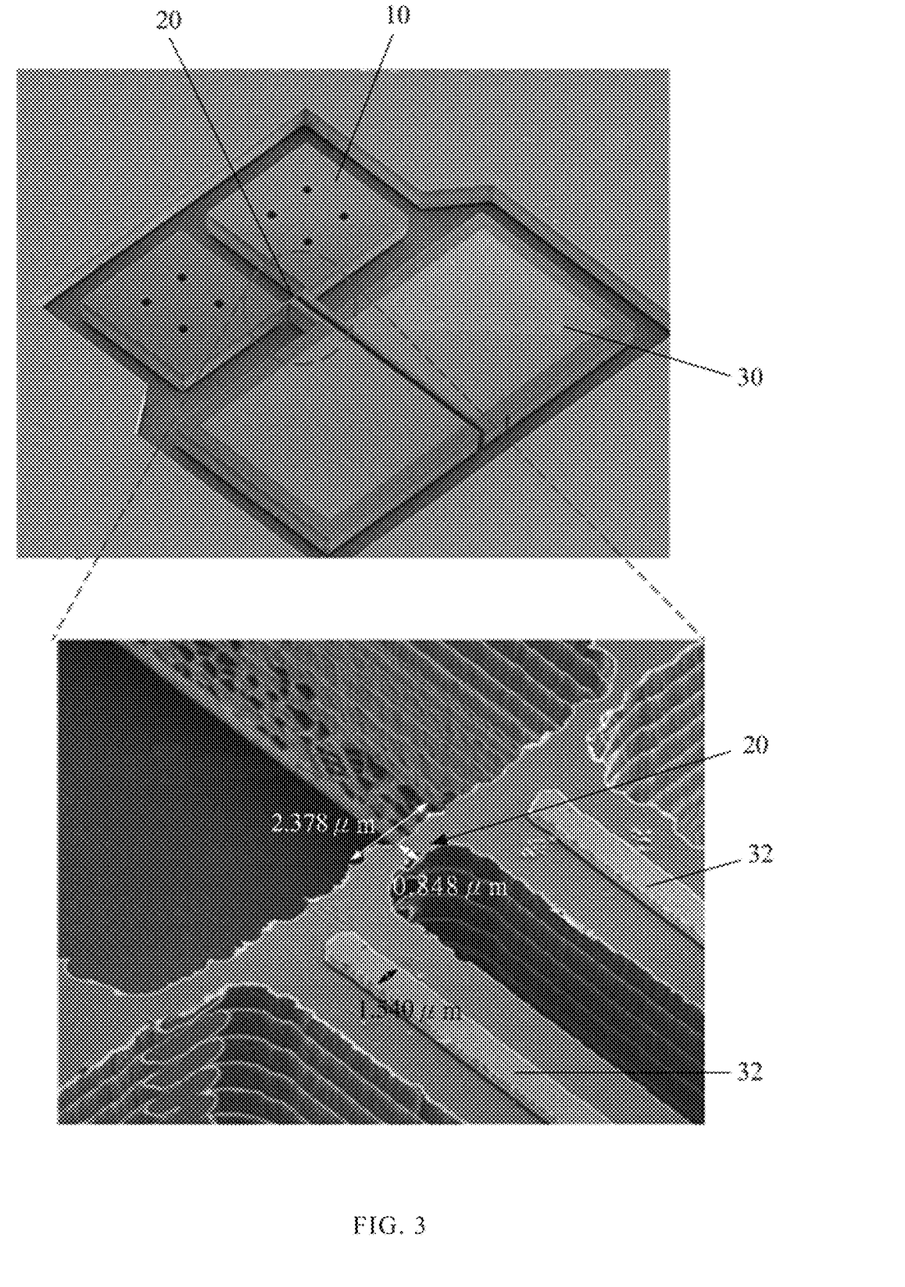
FIG. 3 is a schematic diagram of the second embodiment of the ultra low power thermally-actuated oscillator of the present invention.

Please refer to FIG. 3, the second embodiment is another form of configuration of the present invention which is named as "Free I-Bar". The difference between the first embodiment and the second embodiment is that two end points of the thermally-actuated element 20 are directly connected to the spring structure and electrodes 32 are extended to the surrounding of the thermally-actuated element 20. The main consideration of design is that the parasitic resistance can be effectively reduced by the low electrical resistance of the electrode 32 which is distributed on the original wiring and the supporting structure through the above method. Therefore, all the bias voltage is mainly distributed on the thermally-actuated element 20 and the electrical power is concentrated on the thermally-actuated element 20 so that the heating efficiency of the thermally-actuated element 20 is increased and the total power consumption is reduced.

Further, the parasitic resistance can be reduced by designing the current flow not through the proof masses 10 and shortening the distance between the end points of the electrode 32 of conductive material and the end points of thermally-actuated element 20. Thus, the requirement of the total driving bias voltage can be further effectively reduced. The total power consumption can be further decreased.

For implementation, when the size of the proof masses 10 becomes larger, the proof masses 10 may further include a plurality of apertures for accelerating the etching rate in the etching process and maintaining the size precision. Besides, the apertures may also make the resonance frequency insensitive to the size variation of the proof masses 10 after the fabrication. The pattern of the apertures may be hole features or gap features for implementation.

Figure 4:
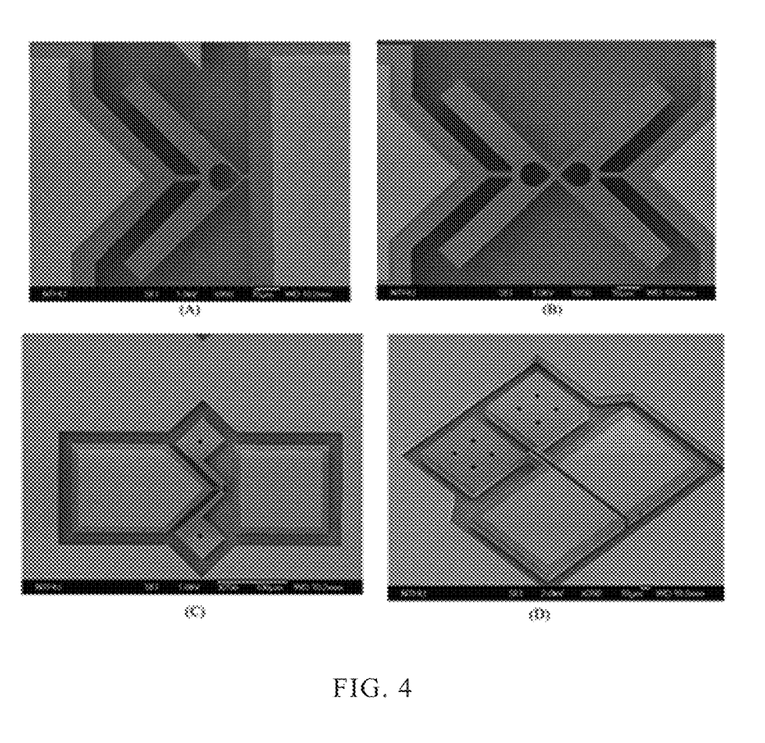
FIG. 4 is a SEM image of different forms of the ultra low power thermally-actuated oscillator of the present invention.

Please refer to FIG. 4, as one can know from the figures, the ultra low power thermally-actuated oscillator may be built by designing and configuring structure elements with a different size ranging from nanometer scale to micrometer scale using MEMS related manufacturing processes on the substrate with piezoresistive properties. The present embodiment only takes single crystal silicon substrate of the ultra low power thermally-actuated oscillator 100 for example, but is not limited thereto. For implementation, no matter the form of Wing-type of the first embodiment or the form of Free I-Bar of the second embodiment, the design of the oscillator of the present invention has advantages such as simple structure, easy manufacturing process, low operating power, and high reliability of elements.

Figure 5:
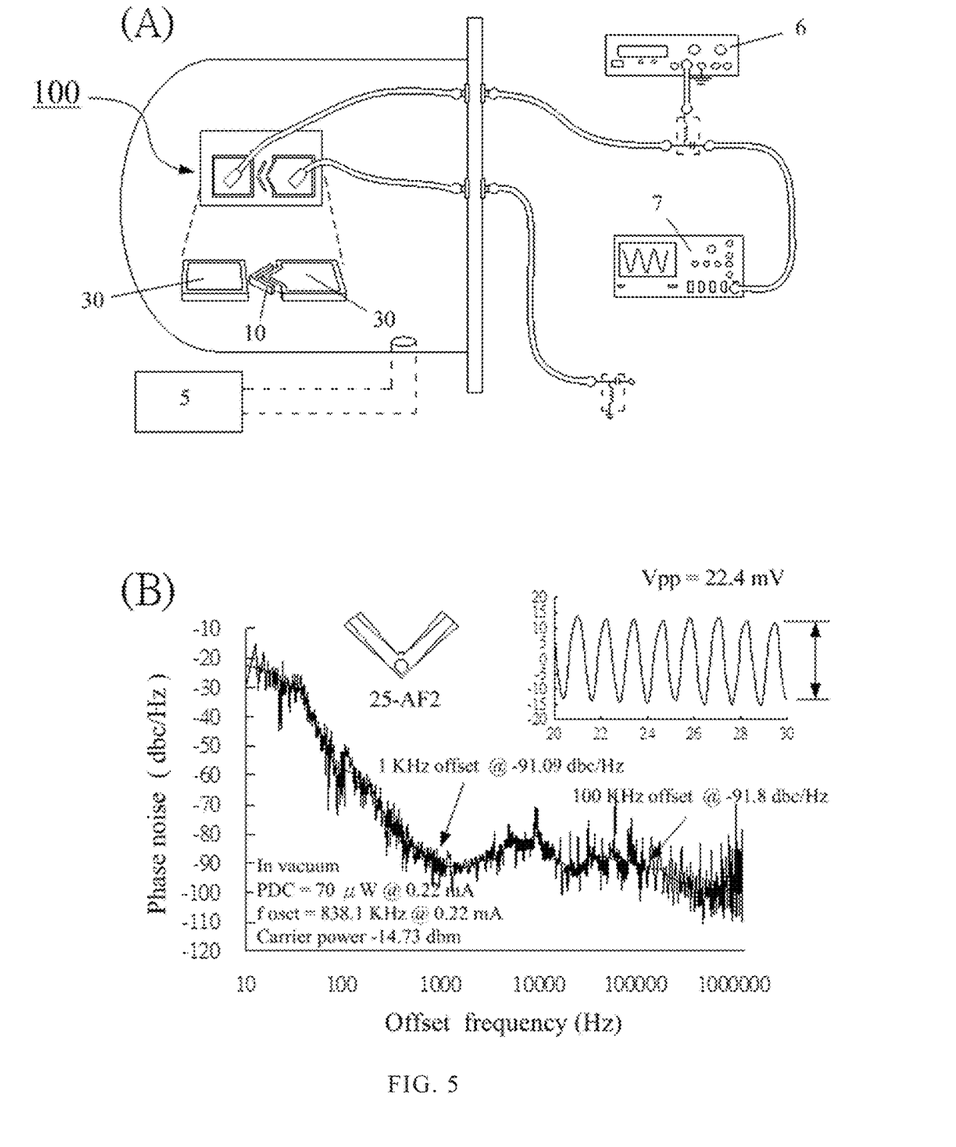
FIG. 5 is an output diagram of phase noise and small signal of the ultra low power thermally-actuated oscillator of the present invention.

Please refer to FIG. 1 and FIG. 5 which show the phase noise and small signal of the ultra low power thermally-actuated oscillator "Wing-type I" of the present invention. First of all, the ultra low power thermally-actuated oscillator 100 is placed in a vacuum chamber and the measurement connectors are electrically connected to the driving element 30. Then, the measurement chamber is evacuated to $10^{-4}$ Torr which leads to a vacuum environment by using a vacuum pump 5. From the experimental results, when 0.22 mA current is applied, a self-sustained oscillation with out-of-plane mode will be generated by the ultra low power thermally-actuated oscillator 100 at working frequency 830 kHz. The required bias power consumption is 70 μW. The input signal provided by the power supply 6 is $V_{pp}$=22.4 mV. The output carrier power measured by frequency spectrum analyze 7 is −41.73 dBm. In the characteristics of the phase noise −91.09 dBc/Hz and −91.8 dBc/Hz are resulted, respectively, when the offset frequencies are at 1 kHz and 100 kHz.

The ultra low power thermally-actuated oscillator 100 disclosed in the first embodiment of the present invention may reach a maximum Q of 14,000 in the vacuum and also have an outstanding performance of reaching Q of 3,000 in the air while the lowest equivalent motional impedance ($R_m$) is 600Ω during the oscillation. If it is used as a mass sensor and the phase noise is converted into Allan Deviation to calculate its mass sensing performance, the minimum mass resolution may be less than 1 femtogram.

The ultra low power thermally-actuated oscillator 100 of the present invention only requires a relatively small bias power to start oscillating compared to the conventional thermally-actuated oscillator. The rotational spring structure 15 has a wide and short geometric structure which can effectively reduce the parasitic resistance and provide a robust support for the proof masses 10. Thus, the thermally-actuated element 20 can be made to a line-shape structure further and the reliability of elements and yield rate can be still maintained to a certain extent. As a result, such line-shape thermally-actuated element 20 can effectively enhance the operating efficiency of power between elements. Not only the bias power can be reduced, but also make the frequency insensitive to the fabrication process.

Even further, the resonance frequencies of the elements may be determined by the rotational spring structure 15. The spring coefficient in the resonance term of the structure thereof is determined by the rotational spring structure 15.

Figure 6:
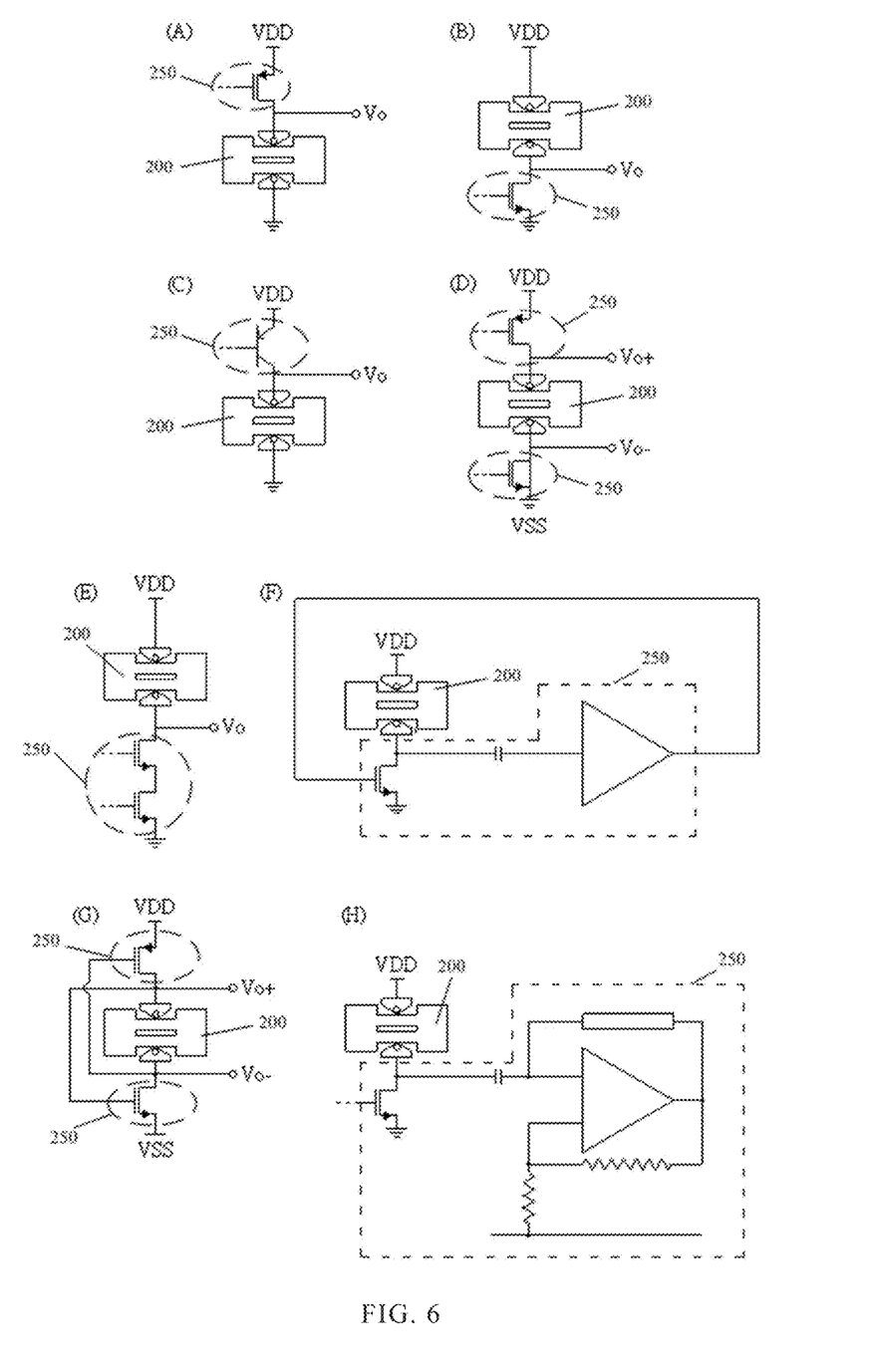
FIG. 6 is a schematic diagram of the driving circuit of the thermally-actuated oscillator of the present invention.

Please refer to FIG. 6, the present invention also provides a driving circuit 250 for thermally-actuated oscillators 200. Wherein, the thermally-actuated oscillator 200 includes two electrodes, at least one set of proof masses, at least one thermally-actuated element and a plurality of driving elements. For implementation, the thermally-actuated element may be formed by line structure to effectively reduce the required bias power. The driving circuit 250 may include a bias transistor, wherein a bias voltage is inputted at a control end of the bias transistor. A current input end and a current output end of the bias transistor and the two electrodes of the thermally-actuated oscillator 200 form a current loop to drive a self-sustained oscillation of the thermally-actuated oscillator 200. For implementation, the driving circuit 250 may also include a detection circuit.

For implementation, the driving circuit 250 may include a voltage amplifier, a current amplifier, a transimpedance amplifier, a transconductance amplifier, a temperature compensation circuit, a frequency counter circuit, a differential circuit, an electrical feedback connection, a phase shifter, a filter, a frequency multiplier, a frequency eliminator or combinations thereof.

Further, the main objective of using bias transistor is to provide a bias current to achieve the condition of self-sustained oscillation. The different bias currents cause the temperature change of the thermally-actuated oscillator 200 and thus change the resonance frequency. Moreover, the bias transistor may combine with different circuit designs to reduce the bias current and power for self-sustained oscillation.

The operation principle of the thermally-actuated oscillator 200 is the mutual coupling between thermal, mechanical and electrical domains. However, the current studies only direct to discuss the configuration between structure elements but rarely to discuss the driving circuit 250. The present invention carries out design and configuration of the driving circuit 250 by using properties of elements such as bias transistor to achieve the self-sustained oscillation of the thermally-actuated oscillator 200. The driving circuit 250 of the present embodiment may regulate the thermally-actuated oscillator 200 not only to reach the self-sustained oscillation but also to finely tune the resonance frequency.

For example, as shown in part (F) and (G) of FIG. 6, the driving circuit 250 may further include positive feedback loop. The positive feedback loop is connected to the control end of the bias transistor and any output end of the thermally-actuated oscillator 200 to reduce the driving power further and also increase the control accuracy of the thermally-actuated oscillator 200.

For implementation, as shown in part (H) of FIG. 6, the driving circuit 250 may further include an equivalent negative resistance circuit. The equivalent negative resistance circuit is equivalently formed between the two ends of the thermally-actuated oscillator 200. The equivalent negative resistance circuit modulates the equivalent parasitic resistance to reduce the driving power.

Since there are no studies for the effect of oscillation of the driving circuit and the proof masses in the conventional oscillators, the present invention carries out improvements of design to each key element and relative configuration relation, such that the thermally-actuated oscillator of the present invention can be regulated by the driving circuit to extend the field of application thereof.

The embodiments described are merely to illustrate the technical thinking and features of the present invention, the purpose thereof is to enable those skilled in the art can understand the contents of the present invention and implement accordingly. Thus, the scope of claims of the present invention should not be limited thereto, that is, the equivalent changes or modifications made in accordance with all spirits disclosed by the present invention should still be encompassed within the scope of claims of the present invention.

What is claimed is:

1. An ultra low power thermally-actuated oscillator, comprising:
    at least one set of proof masses, symmetrically disposed and suspended from a substrate by at least one spring structure;
    at least one thermally-actuated element, being a line structure to enhance electrical impedance of the thermally-actuated oscillator and reduce thermal capacitance of the thermally-actuated oscillator, the at least one thermally-actuated element connected to the at least one set of proof masses; and a plurality of driving elements, respectively disposed on both sides of the at least one thermally-actuated element to provide a driving current, when the driving current flows through the at least one thermally-actuated element, the at least one thermally-actuated element will be deformed and thus the at least one set of proof masses will be driven to produce a harmonic oscillation;

wherein a structural thickness of at least one line of the line structure is smaller than the thickness of the proof masses.

2. The ultra low power thermally-actuated oscillator of claim 1, wherein the line structure is a single-line line structure or an array-line line structure, and with a width or thickness of at least one line of the line structure thereof is smaller than 2 μm.

3. The ultra low power thermally-actuated oscillator of claim 1, wherein the at least one spring structure comprises a stretching spring structure, a rotational spring structure or combinations thereof.

4. The ultra low power thermally-actuated oscillator of claim 1, wherein the plurality of driving elements further comprises two electrodes made of an electrically conductive material.

5. An ultra low power thermally-actuated oscillator, comprising:
   at least one set of proof masses, symmetrically disposed and suspended from a substrate by at least one spring structure;
   at least one thermally-actuated element, being a line structure to enhance electrical impedance of the thermally-actuated oscillator and reduce thermal capacitance of the thermally-actuated oscillator, the at least one thermally-actuated element directly connected to the at least one spring structure; and
   a plurality of driving elements, respectively disposed on both sides of the at least one thermally-actuated element to provide a driving current, when the driving current flows through the at least one thermally-actuated element, the at least one thermally-actuated element will be deformed and thus the at least one set of proof masses will be driven to produce a harmonic oscillation;
   wherein a structural thickness of at least one line of the structure is smaller than the thickness of the proof masses.

6. The ultra low power thermally-actuated oscillator of claim 5, wherein the line structure is a single-line line structure or an array-line line structure, and with a width or thickness of at least one line of the line structure thereof is smaller than 2 μm.

7. The ultra low power thermally-actuated oscillator of claim 5, wherein the at least one spring structure comprises a stretching spring structure, a rotational spring structure or combinations thereof.

8. The ultra low power thermally-actuated oscillator of claim 5, wherein the plurality of driving elements further comprises two electrodes made of an electrically conductive material.

9. A driving circuit of thermally-actuated oscillator, comprising:
   a thermally-actuated oscillator, comprising:
      at least two electrodes;
      at least one set of proof masses, symmetrically disposed and suspended from a substrate by at least one spring structure;
      at least one thermally-actuated element; and
   a driving circuit, comprising a bias transistor, a bias voltage inputted at a control end of the bias transistor, a current input end and a current output end of the bias transistor and the at least two electrodes forming a current loop to drive a self-sustained oscillation of the thermally-actuated oscillator;
   wherein the thermally-actuated element is a line structure, a structural thickness of at least one line thereof is smaller than the thickness of the proof masses.

10. The driving circuit of thermally-actuated oscillator of claim 9, wherein the driving circuit further comprises a positive feedback loop, the positive feedback loop is connected to the control end of the bias transistor to reduce the driving power.

11. The driving circuit of thermally-actuated oscillator of claim 9, wherein the driving circuit further comprises a negative resistance circuit, the negative resistance circuit is connected to the two ends of the thermally-actuated oscillator to reduce the driving power.

12. The driving circuit of thermally-actuated oscillator of claim 9, wherein the driving circuit comprises an amplifier in order to increase the control accuracy of the thermally-actuated oscillator.

* * * * *